(12) United States Patent
White

(10) Patent No.: US 11,438,487 B2
(45) Date of Patent: Sep. 6, 2022

(54) VEHICULAR CAMERA WITH THERMAL INTERFACE MATERIAL

(71) Applicant: Magna Electronics Inc., Auburn Hills, MI (US)

(72) Inventor: Jeffrey A. White, Howell, MI (US)

(73) Assignee: MAGNA ELECTRONICS INC., Auburn Hills, MI (US)

( * ) Notice: Subject to any disclaimer, the term of this patent is extended or adjusted under 35 U.S.C. 154(b) by 0 days.

(21) Appl. No.: 16/811,106

(22) Filed: Mar. 6, 2020

(65) Prior Publication Data

US 2020/0288049 A1 Sep. 10, 2020

Related U.S. Application Data

(60) Provisional application No. 62/814,942, filed on Mar. 7, 2019.

(51) Int. Cl.
*H04N 5/225* (2006.01)
*B60R 11/04* (2006.01)
*H05K 7/20* (2006.01)
*H05K 1/18* (2006.01)
*B60R 11/00* (2006.01)
*B60R 11/02* (2006.01)
*B60R 16/02* (2006.01)

(52) U.S. Cl.
CPC ......... *H04N 5/22521* (2018.08); *B60R 11/04* (2013.01); *H04N 5/2252* (2013.01); *H04N 5/2253* (2013.01); *H05K 1/181* (2013.01); *H05K 7/20854* (2013.01); *B60R 11/0229* (2013.01); *B60R 16/0207* (2013.01); *B60R 2011/004* (2013.01); *B60R 2011/0026* (2013.01); *B60R 2300/105* (2013.01); *B60R 2300/607* (2013.01); *B60R 2300/8093* (2013.01); *H05K 2201/10121* (2013.01); *H05K 2201/10189* (2013.01)

(58) Field of Classification Search
CPC .................................................. H04N 5/22521
USPC .......................................................... 348/373
See application file for complete search history.

(56) References Cited

U.S. PATENT DOCUMENTS

| | | | |
|---|---|---|---|
| 5,550,677 A | 8/1996 | Schofield et al. |
| 5,670,935 A | 9/1997 | Schofield et al. |
| 5,872,332 A | 2/1999 | Verma |
| 5,949,331 A | 9/1999 | Schofield et al. |
| 6,483,101 B1 | 11/2002 | Webster |
| 7,038,577 B2 | 5/2006 | Pawlicki et al. |

(Continued)

*Primary Examiner* — Joel W Fosselman
(74) *Attorney, Agent, or Firm* — Honigman LLP

(57) ABSTRACT

A vehicular camera module for a vehicular vision system includes a housing having a front housing portion and a rear housing portion. A circuit board includes a circuit board substrate having electronic circuitry disposed thereat. A thermal interface material is molded at an inner surface of the housing. The front housing portion is attached at the circuit board and the rear housing portion is mated with the front housing portion to encase the circuit board. The thermal interface material is formed to interface with electronic components of the circuit board and may conform with the electronic components at the circuit board substrate when the front housing portion is attached at the circuit board and/or when the rear housing portion is mated with the front housing portion. A connector element in electrical contact with circuitry of the circuit board is configured to connect to a connector end of a wire harness.

17 Claims, 2 Drawing Sheets

(56) References Cited

U.S. PATENT DOCUMENTS

| | | |
|---|---|---|
| 7,720,580 B2 | 5/2010 | Higgins-Luthman |
| 7,855,755 B2 | 12/2010 | Weller et al. |
| 7,965,336 B2 | 6/2011 | Bingle et al. |
| 8,542,451 B2 | 9/2013 | Lu et al. |
| 8,994,878 B2 | 3/2015 | Byrne et al. |
| 9,077,098 B2 | 7/2015 | Latunski |
| 9,233,641 B2 | 1/2016 | Sesti et al. |
| 9,596,387 B2 | 3/2017 | Achenbach et al. |
| 9,871,971 B2 | 1/2018 | Wang et al. |
| 9,896,039 B2 | 2/2018 | Achenbach et al. |
| 10,142,532 B2 | 11/2018 | Mleczko |
| 2004/0075870 A1* | 4/2004 | Karaki ............... H04N 1/21 358/296 |
| 2004/0077118 A1 | 4/2004 | Prior |
| 2009/0244361 A1 | 10/2009 | Gebauer et al. |
| 2013/0242099 A1 | 9/2013 | Sauer et al. |
| 2014/0373345 A1 | 12/2014 | Steigerwald |
| 2015/0205186 A1* | 7/2015 | Park ............... G03B 17/08 348/373 |
| 2015/0222795 A1 | 8/2015 | Sauer et al. |
| 2015/0266430 A1 | 9/2015 | Mleczko et al. |
| 2015/0365569 A1 | 12/2015 | Mai et al. |
| 2016/0037028 A1 | 2/2016 | Biemer |
| 2016/0243987 A1 | 8/2016 | Kendall |
| 2016/0268716 A1 | 9/2016 | Conger et al. |
| 2017/0048463 A1 | 2/2017 | Mleczko |
| 2017/0133811 A1 | 5/2017 | Conger et al. |
| 2017/0201661 A1 | 7/2017 | Conger |
| 2017/0295306 A1 | 10/2017 | Mleczko |
| 2017/0302829 A1 | 10/2017 | Mleczko et al. |
| 2018/0098033 A1 | 4/2018 | Mleczko et al. |

* cited by examiner

VEHICULAR CAMERA WITH THERMAL INTERFACE MATERIAL

CROSS REFERENCE TO RELATED APPLICATION

The present application claims the filing benefits of U.S. provisional application Ser. No. 62/814,942, filed Mar. 7, 2019, which is hereby incorporated herein by reference in its entirety.

FIELD OF THE INVENTION

The present invention relates generally to a vehicle vision system for a vehicle and, more particularly, to a vehicle vision system that utilizes one or more cameras at a vehicle.

BACKGROUND OF THE INVENTION

Use of imaging sensors in vehicle imaging systems is common and known. Examples of such known systems are described in U.S. Pat. Nos. 5,949,331; 5,670,935 and/or 5,550,677, which are hereby incorporated herein by reference in their entireties. Various cameras have been proposed for such imaging systems, including cameras of the types described in U.S. Pat. No. 7,965,336 and U.S. Publication No. US-2009-0244361, which are hereby incorporated herein by reference in their entireties.

SUMMARY OF THE INVENTION

The present invention provides a vision system or imaging system for a vehicle that utilizes one or more cameras (preferably one or more CMOS cameras) to capture image data representative of images exterior of the vehicle. The camera comprises an imager and a circuit board (or circuit boards) and a lens. A thermal interface elastomer or element is molded into the lens holder or lens assembly (and/or optionally the rear housing portion of the camera housing), with the elastomer formed with a geometric shape that is pressed against the circuit board during assembly of the camera. The thermal interface elastomer comprises a thermally conductive material and may be molded onto the lens holder side of the circuit board and/or on the housing side of the circuit board.

These and other objects, advantages, purposes and features of the present invention will become apparent upon review of the following specification in conjunction with the drawings.

DESCRIPTION OF THE PREFERRED EMBODIMENTS

A vehicle vision system and/or driver assist system and/or object detection system and/or alert system operates to capture images exterior of the vehicle and may process the captured image data to display images and to detect objects at or near the vehicle and in the predicted path of the vehicle, such as to assist a driver of the vehicle in maneuvering the vehicle in a rearward direction. The vision system includes an image processor or image processing system that is operable to receive image data from one or more cameras and provide an output to a display device for displaying images representative of the captured image data. Optionally, the vision system may provide display, such as a rearview display or a top down or bird's eye or surround view display or the like.

Figure 1:
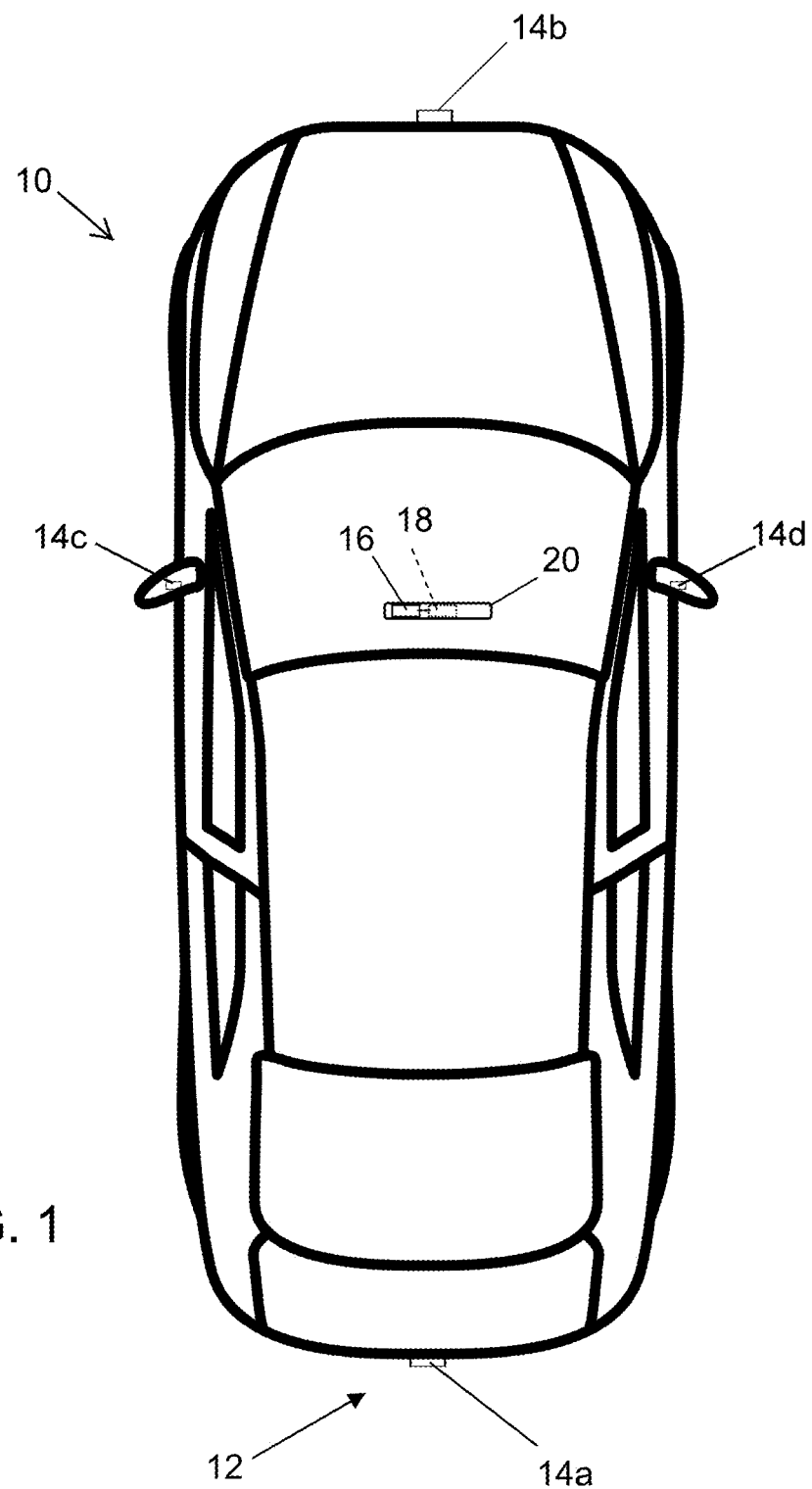
FIG. 1 is a plan view of a vehicle with a vision system that incorporates a plurality of exterior viewing cameras.

Referring now to the drawings and the illustrative embodiments depicted therein, a vehicle 10 includes an imaging system or vision system 12 that includes at least one exterior viewing imaging sensor or camera, such as a rearward viewing imaging sensor or camera 14a (and the system may optionally include multiple exterior viewing imaging sensors or cameras, such as a forward viewing camera 14b at the front (or at the windshield) of the vehicle, and a sideward/rearward viewing camera 14c, 14d at respective sides of the vehicle), which captures images exterior of the vehicle, with the camera having a lens for focusing images at or onto an imaging array or imaging plane or imager of the camera (FIG. 1). Optionally, a forward viewing camera may be disposed at the windshield of the vehicle and view through the windshield and forward of the vehicle, such as for a machine vision system (such as for traffic sign recognition, headlamp control, pedestrian detection, collision avoidance, lane marker detection and/or the like). The vision system 12 includes a control or electronic control unit (ECU) 18 that includes an image processor and associated software, with the image processor being operable to process image data captured by the camera or cameras. The ECU, responsive to image processing by the image processor of captured image data, may detect objects or the like and/or provide displayed images at a display device 16 for viewing by the driver of the vehicle (although shown in FIG. 1 as being part of or incorporated in or at an interior rearview mirror assembly 20 of the vehicle, the control and/or the display device may be disposed elsewhere at or in the vehicle). The data transfer or signal communication from the camera to the ECU may comprise any suitable data or communication link, such as a vehicle network bus or the like of the equipped vehicle.

Figure 2:
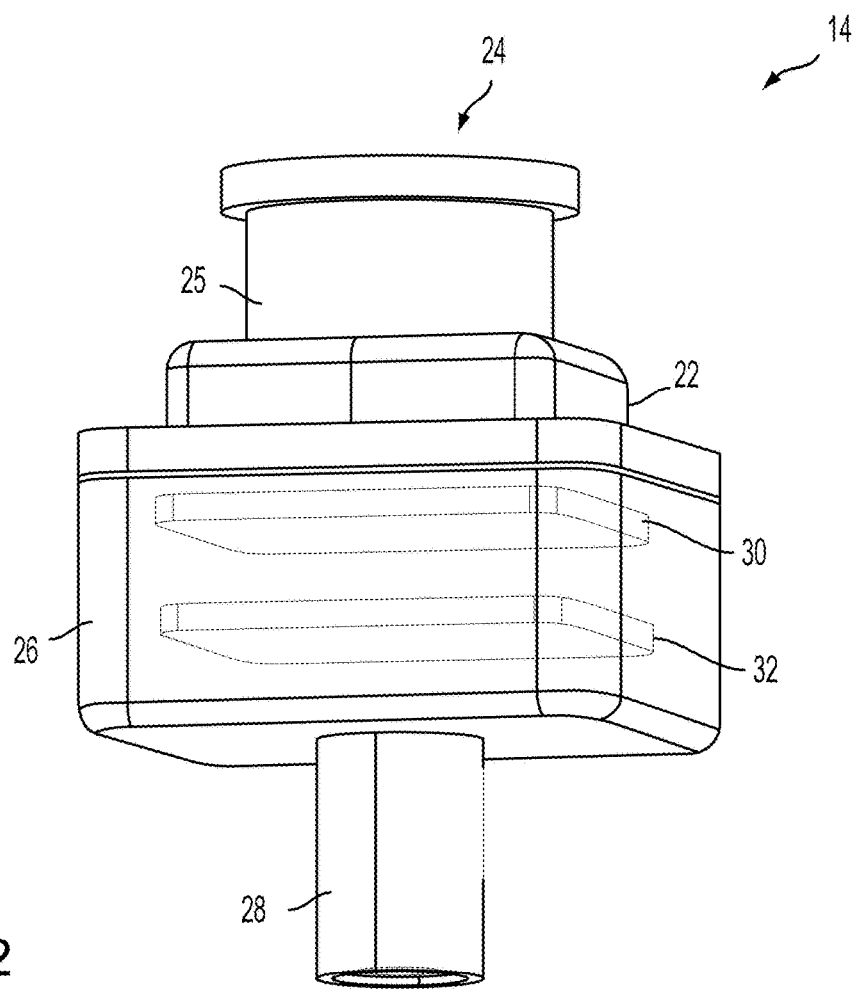
FIG. 2 is a perspective view of a camera suitable for use in the vision system.

As shown in FIG. 2, a camera module 14 comprises a lens 24 disposed in a lens barrel 25 at a lens holder 22 (or front camera housing portion), an imager disposed at a printed circuit board 30 with associated circuitry, and an electrical connector 28 for electrically connecting the circuitry and imager to a vehicle connector when the camera is disposed at the vehicle. The camera may include a second or connector printed circuit board disposed in the housing 26 and electrically connected to the imager printed circuit board 30. The vehicle camera may be compact in size with reduced components, and with reduced cost and short or reduced manufacturing cycle times. The vehicle camera may also provide scalable architecture and customer independent technology (such as direct connect, pigtail connector, brackets and/or the like) so that the camera is readily adaptable for different applications.

Figure 3:
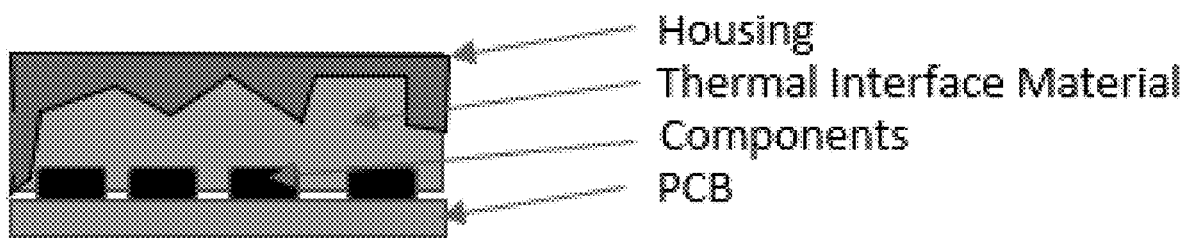
FIG. 3 is an enlarged sectional view of a portion of the camera, showing the thermal interface material disposed at the PCB and housing in accordance with the present invention.

As shown in FIG. 3, the camera module 14 of the present invention comprises a thermal interface element or material disposed between the housing and the PCB and components disposed at the PCB. The thermal interface material may comprise a two-shot, thermally conductive, rubber overmold that creates a more intimate interface between the thermal interface material and the housing. For example, the front housing portion or lens holder may comprise a plastic molded housing portion and the thermal interface material may be molded onto the inner surface of the plastic molded housing as a second shot or second molding process. Optionally, the lens holder or front housing portion may comprise a metal housing portion and the thermal interface material may be molded onto the inner surface of the metal housing portion. The thermal interface material may be contoured or formed to align better with varying component heights and even to contact the PCB substrate if needed while minimizing the stresses that arise with use of a single or constant height pad and the varying component heights. The thermal interface elastomer may be molded at the lens holder or front housing portion and may have a custom geometric shape or form that is pressed against the PCB. The camera may be otherwise assembled in a known manner.

Although described as having the thermal interface elastomer at the lens assembly side of the PCB, the thermal interface elastomer may also or otherwise be disposed at the housing side of the PCB. For example, the camera module may also or otherwise comprise a thermal interface element or material disposed between the rear housing portion and the PCB and components disposed at the rear side of the PCB. The thermal interface material may comprise a two-shot, thermally conductive, rubber over-mold that creates a more intimate interface between the thermal interface material and the inner surface of the rear housing portion. For example, the rear housing portion may comprise a plastic molded housing portion and the thermal interface material may be molded onto the inner surface of the plastic molded housing as a second shot or second molding process. Optionally, the rear housing portion may comprise a metal housing portion and the thermal interface material may be molded onto the inner surface of the metal housing portion. The thermal interface material may be contoured or formed to align better with varying component heights and even to contact the PCB substrate if needed while minimizing the stresses that arise with use of a single or constant height pad and the varying component heights. The thermal interface elastomer may be molded at the rear housing portion and may have a custom geometric shape or form that is pressed against the rear side of the PCB. The thermal interface elastomer may engage and conform to the electronic components (e.g., a processing chip or image processor or the like) at the rear side of the PCB substrate as the rear housing portion is mated with the front housing portion to encase the PCB in the camera housing.

The thermal interface material or element or elements thus may replace the known hand-placed silicone thermal pads, whereby the camera may be easier to assemble, with enhanced contact or interface with the part body, and more flexibility for variable housing geometry and PCB component heights. The thermal interface material may comprise any suitable material, such as, for example, a low durometer rubber material with a thermally conductive filler. Prior constructions are not compliant enough to completely conform or deform out to the sides of components on the PCB and could actually be held away from the PCB all together by the components. The system and thermally conductive interface material allows for custom molding the thermal material or pad or element so it can bypass the components and reach the board between the components (i.e., it is easily conformable or deformable so as to conform to the components at the opposing side of the circuit board substrate and flow or deform sufficiently so as to substantially envelop or encase the components and contact the circuit board substrate). Prior systems are difficult to implement, especially at the front of cameras because they may adversely affect focus and even interfere with the imagers. The system of the present invention retains the imager where it is intended as the thermally conductive interface material is attached to the front housing.

During assembly of the camera module, the PCB, with the imager disposed thereat, is positioned at the lens holder or lens barrel, and a bead of adhesive may be disposed at the PCB. The PCB and lens holder may be plasma treated before the adhesive is applied to provide the benefit of a cleaning the imager surface. The PCB is then adhered to the lens holder, and the lens is centered and optically aligned at the imager, and the adhesive is at least initially cured to hold the lens relative to the PCB and in optical alignment with the imager. The adhesive and aligning and curing processes may utilize aspects of the systems and methods described in U.S. Pat. Nos. 8,542,451 and 9,277,104, which are hereby incorporated herein by reference in their entireties.

Optionally, the camera module may include an adjustable focus feature, such as by utilizing a micro electro-mechanical system (MEMS). For example, the camera may include a control device in the housing that receives a controlling signal (such as responsive to a user input or an automatic control signal or the like) and adjusts a position of the imager relative to the lens to establish the desired or selected or appropriate focus or focal length of the camera, such as by utilizing aspects of the cameras described in U.S. Pat. No. 10,142,532 and/or U.S. Publication No. US-2017-0048463, which are hereby incorporated herein by reference in their entireties.

The camera module may utilize aspects of the cameras and connectors described in U.S. Pat. Nos. 9,896,039; 9,871,971; 9,596,387; 9,233,641; 9,077,098; 8,994,878 and/or 7,965,336, and/or U.S. Publication Nos. US-2009-0244361; US-2013-0242099; US-2014-0373345; US-2015-0222795; US-2015-0266430; US-2015-0365569; US-2016-0037028; US-2016-0243987; US-2016-0268716; US-2017-0133811; US-2017-0201661; US-2017-0295306; US-2017-0302829 and/or US-2018-0098033, which are hereby incorporated herein by reference in their entireties.

The system includes an image processor operable to process image data captured by the camera or cameras, such as for detecting objects or other vehicles or pedestrians or the like in the field of view of one or more of the cameras. For example, the image processor may comprise an image processing chip selected from the EYEQ family of image processing chips available from Mobileye Vision Technologies Ltd. of Jerusalem, Israel, and may include object detection software (such as the types described in U.S. Pat. Nos. 7,855,755; 7,720,580 and/or 7,038,577, which are hereby incorporated herein by reference in their entireties), and may analyze image data to detect vehicles and/or other objects. Responsive to such image processing, and when an object or other vehicle is detected, the system may generate an alert to the driver of the vehicle and/or may generate an overlay at the displayed image to highlight or enhance display of the detected object or vehicle, in order to enhance the driver's awareness of the detected object or vehicle or hazardous condition during a driving maneuver of the equipped vehicle.

The vehicle may include any type of sensor or sensors, such as imaging sensors or radar sensors or lidar sensors or ultrasonic sensors or the like. The imaging sensor or camera may capture image data for image processing and may comprise any suitable camera or sensing device, such as, for example, a two dimensional array of a plurality of photosensor elements arranged in at least 640 columns and 480 rows (at least a 640×480 imaging array, such as a megapixel imaging array or the like), with a respective lens focusing images onto respective portions of the array. The photosensor array may comprise a plurality of photosensor elements arranged in a photosensor array having rows and columns. Preferably, the imaging array has at least 300,000 photosensor elements or pixels, more preferably at least 500,000 photosensor elements or pixels and more preferably at least 1 million photosensor elements or pixels. The imaging array may capture color image data, such as via spectral filtering at the array, such as via an RGB (red, green and blue) filter or via a red/red complement filter or such as via an RCC (red, clear, clear) filter or the like. The logic and control circuit of the imaging sensor may function in any known manner, and the image processing and algorithmic processing may comprise any suitable means for processing the images and/or image data.

For example, the vision system and/or processing and/or camera and/or circuitry may utilize aspects described in U.S. Pat. Nos. 9,233,641; 9,146,898; 9,174,574; 9,090,234; 9,077,098; 8,818,042; 8,886,401; 9,077,962; 9,068,390; 9,140,789; 9,092,986; 9,205,776; 8,917,169; 8,694,224; 7,005,974; 5,760,962; 5,877,897; 5,796,094; 5,949,331; 6,222,447; 6,302,545; 6,396,397; 6,498,620; 6,523,964; 6,611,202; 6,201,642; 6,690,268; 6,717,610; 6,757,109; 6,802,617; 6,806,452; 6,822,563; 6,891,563; 6,946,978; 7,859,565; 5,550,677; 5,670,935; 6,636,258; 7,145,519; 7,161,616; 7,230,640; 7,248,283; 7,295,229; 7,301,466; 7,592,928; 7,881,496; 7,720,580; 7,038,577; 6,882,287; 5,929,786 and/or 5,786,772, and/or U.S. Publication Nos. US-2014-0340510; US-2014-0313339; US-2014-0347486; US-2014-0320658; US-2014-0336876; US-2014-0307095; US-2014-0327774; US-2014-0327772; US-2014-0320636; US-2014-0293057; US-2014-0309884; US-2014-0226012; US-2014-0293042; US-2014-0218535; US-2014-0218535; US-2014-0247354; US-2014-0247355; US-2014-0247352; US-2014-0232869; US-2014-0211009; US-2014-0160276; US-2014-0168437; US-2014-0168415; US-2014-0160291; US-2014-0152825; US-2014-0139676; US-2014-0138140; US-2014-0104426; US-2014-0098229; US-2014-0085472; US-2014-0067206; US-2014-0049646; US-2014-0052340; US-2014-0025240; US-2014-0028852; US-2014-005907; US-2013-0314503; US-2013-0298866; US-2013-0222593; US-2013-0300869; US-2013-0278769; US-2013-0258077; US-2013-0258077; US-2013-0242099; US-2013-0215271; US-2013-0141578 and/or US-2013-0002873, which are all hereby incorporated herein by reference in their entireties. The system may communicate with other communication systems via any suitable means, such as by utilizing aspects of the systems described in International Publication Nos. WO/2010/144900; WO 2013/043661 and/or WO 2013/081985, and/or U.S. Pat. No. 9,126,525, which are hereby incorporated herein by reference in their entireties.

Changes and modifications in the specifically described embodiments can be carried out without departing from the principles of the invention, which is intended to be limited only by the scope of the appended claims, as interpreted according to the principles of patent law including the doctrine of equivalents.

The invention claimed is:

1. A vehicular camera module for a vision system of a vehicle, the vehicular camera module comprising:
    a housing comprising a front housing portion and a rear housing portion;
    wherein the front housing portion includes a lens holder that accommodates a lens assembly therein, the lens assembly including at least one optical element;
    a circuit board, the circuit board comprising a circuit board substrate having a first side and a second side opposite the first side, wherein the circuit board comprises electronic circuitry disposed at the circuit board substrate, and wherein an imager and electronic components of the electronic circuitry are disposed at the first side of the circuit board substrate;
    a thermal interface material molded at an inner surface of the front housing portion;
    wherein the front housing portion, with the thermal interface material molded thereat, is disposed at the circuit board, and wherein, with the lens assembly optically aligned with the imager at the first side of the circuit board substrate, the circuit board is attached at the front housing portion;
    wherein the thermal interface material is formed to interface with the electronic components at the first side of the circuit board substrate when the front housing portion is attached at the circuit board;
    wherein the rear housing portion is mated with the front housing portion to encase the circuit board within the housing;
    a connector element in electrical connection with the electronic circuitry of the circuit board, wherein, with the rear housing portion mated with the front housing portion, the connector element is at the rear housing portion;
    wherein the connector element is configured to connect to a connector end of a wire harness of a vehicle to electrically connect the wire harness to the electronic circuitry of the circuit board when the vehicular camera module is mounted at the vehicle; and
    wherein the thermal interface material comprises a thermally conductive rubber over-mold that is molded over at least a portion of the inner surface of said front housing portion.

2. The vehicular camera module of claim 1, wherein the thermal interface material is contoured so as to interface with electronic components of different heights at the first side of the circuit board substrate.

3. The vehicular camera module of claim 2, wherein the thermal interface material contacts the circuit board substrate.

4. The vehicular camera module of claim 2, wherein the thermal interface material is molded at the inner surface of the front housing portion and has a custom geometric form that corresponds with the shape of the electronic components at the first side of the circuit board substrate, and wherein the thermal interface material is pressed against the circuit board when the front housing portion is attached at the circuit board during assembly of the vehicular camera module.

5. A vehicular camera module for a vision system of a vehicle, the vehicular camera module comprising:
    a housing comprising a front housing portion and a rear housing portion;
    wherein the front housing portion includes a lens holder that accommodates a lens assembly therein, the lens assembly including at least one optical element;
    a circuit board, the circuit board comprising a circuit board substrate having a first side and a second side opposite the first side, wherein the circuit board comprises electronic circuitry disposed at the circuit board substrate, and wherein an imager and electronic components of the electronic circuitry are disposed at the first side of the circuit board substrate;

a thermal interface material molded at an inner surface of the front housing portion;

wherein the front housing portion, with the thermal interface material molded thereat, is disposed at the circuit board, and wherein, with the lens assembly optically aligned with the imager at the first side of the circuit board substrate, the circuit board is attached at the front housing portion;

wherein the thermal interface material is formed to interface with the electronic components at the first side of the circuit board substrate when the front housing portion is attached at the circuit board;

wherein the rear housing portion is mated with the front housing portion to encase the circuit board within the housing;

a connector element in electrical connection with the electronic circuitry of the circuit board, wherein, with the rear housing portion mated with the front housing portion, the connector element is at the rear housing portion;

wherein the connector element is configured to connect to a connector end of a wire harness of a vehicle to electrically connect the wire harness to the electronic circuitry of the circuit board when the vehicular camera module is mounted at the vehicle; and wherein the electronic circuitry of the circuit board comprises electronic components at the second side of the circuit board substrate, and wherein another thermal interface material is molded at the rear housing portion and interfaces with the electronic components at the second side of the circuit board substrate when the rear housing portion is mated with the front housing portion.

6. The vehicular camera module of claim 5, wherein the other thermal interface material has a custom geometric form that corresponds with the shapes of the electronic components at the second side of the circuit board substrate, and wherein the thermal interface material is pressed against the circuit board when the rear housing portion is mated with the front housing portion during assembly of the vehicular camera module.

7. The vehicular camera module of claim 5, wherein the other thermal interface material is contoured so as to interface with electronic components of different heights at the second side of the circuit board substrate.

8. A vehicular camera module for a vision system of a vehicle, the vehicular camera module comprising:

a housing comprising a front housing portion and a rear housing portion;

wherein the front housing portion includes a lens holder that accommodates a lens assembly therein, the lens assembly including at least one optical element;

a circuit board, the circuit board comprising a circuit board substrate having a first side and a second side opposite the first side, wherein the circuit board comprises electronic circuitry disposed at the circuit board substrate, and wherein an imager and electronic components of the electronic circuitry are disposed at the first side of the circuit board substrate;

a thermal interface material molded at an inner surface of the front housing portion;

wherein the front housing portion, with the thermal interface material molded thereat, is disposed at the circuit board, and wherein, with the lens assembly optically aligned with the imager at the first side of the circuit board substrate, the circuit board is attached at the front housing portion;

wherein the thermal interface material is formed to interface with the electronic components at the first side of the circuit board substrate when the front housing portion is attached at the circuit board;

wherein the rear housing portion is mated with the front housing portion to encase the circuit board within the housing;

a connector element in electrical connection with the electronic circuitry of the circuit board, wherein, with the rear housing portion mated with the front housing portion, the connector element is at the rear housing portion;

wherein the connector element is configured to connect to a connector end of a wire harness of a vehicle to electrically connect the wire harness to the electronic circuitry of the circuit board when the vehicular camera module is mounted at the vehicle; and wherein the thermal interface material comprises a deformable material, and wherein the thermal interface material conforms to electronic components at the first side of the circuit board substrate when the rear housing portion is mated with the front housing portion to encase the circuit board.

9. A vehicular camera module for a vision system of a vehicle, the vehicular camera module comprising:

a housing comprising a front housing portion and a rear housing portion;

wherein the front housing portion includes a lens holder that accommodates a lens assembly therein, the lens assembly including at least one optical element;

a circuit board, the circuit board comprising a circuit board substrate having a first side and a second side opposite the first side, wherein the circuit board comprises electronic circuitry disposed at the circuit board substrate, and wherein an imager and electronic components of the electronic circuitry are disposed at the first side of the circuit board substrate;

a thermal interface material molded at an inner surface of the front housing portion;

wherein the front housing portion, with the thermal interface material molded thereat, is disposed at the circuit board, and wherein, with the lens assembly optically aligned with the imager at the first side of the circuit board substrate, the circuit board is attached at the front housing portion;

wherein the thermal interface material is formed to interface with the electronic components at the first side of the circuit board substrate when the front housing portion is attached at the circuit board;

wherein the rear housing portion is mated with the front housing portion to encase the circuit board within the housing;

a connector element in electrical connection with the electronic circuitry of the circuit board, wherein, with the rear housing portion mated with the front housing portion, the connector element is at the rear housing portion;

wherein the connector element is configured to connect to a connector end of a wire harness of a vehicle to electrically connect the wire harness to the electronic circuitry of the circuit board when the vehicular camera module is mounted at the vehicle; and wherein the vehicular camera module is configured to be disposed at an exterior portion of the vehicle so as to have a field of view exterior of the vehicle.

10. A vehicular camera module for a vision system of a vehicle, the vehicular camera module comprising:

a housing comprising a front housing portion and a rear housing portion;

wherein the front housing portion includes a lens holder that accommodates a lens assembly therein, the lens assembly including at least one optical element;

a circuit board, the circuit board comprising a circuit board substrate having a first side and a second side opposite the first side, wherein the circuit board comprises electronic circuitry disposed at the circuit board substrate, and wherein an imager and electronic components of the electronic circuitry are disposed at the first side of the circuit board substrate;

a thermal interface material molded at an inner surface of the front housing portion;

wherein the front housing portion, with the thermal interface material molded thereat, is disposed at the circuit board, and wherein, with the lens assembly optically aligned with the imager at the first side of the circuit board substrate, the circuit board is attached at the front housing portion;

wherein the thermal interface material is formed to interface with the electronic components at the first side of the circuit board substrate when the front housing portion is attached at the circuit board;

wherein the rear housing portion is mated with the front housing portion to encase the circuit board within the housing;

a connector element in electrical connection with the electronic circuitry of the circuit board, wherein, with the rear housing portion mated with the front housing portion, the connector element is at the rear housing portion;

wherein the connector element is configured to connect to a connector end of a wire harness of a vehicle to electrically connect the wire harness to the electronic circuitry of the circuit board when the vehicular camera module is mounted at the vehicle; and wherein the connector element comprises a coaxial connector element configured to electrically connect to a coaxial connector end of a coaxial wire harness of the vehicle.

11. A vehicular camera module for a vision system of a vehicle, the vehicular camera module comprising:

a housing comprising a front housing portion and a rear housing portion;

wherein the front housing portion includes a lens holder that accommodates a lens assembly therein, the lens assembly including at least one optical element;

a circuit board, the circuit board comprising a circuit board substrate having a first side and a second side opposite the first side, wherein the circuit board comprises electronic circuitry disposed at the circuit board substrate, and wherein an imager of the electronic circuitry is disposed at the first side of the circuit board substrate, and wherein at least one electronic component of the electronic circuitry is disposed at the second side of the circuit board substrate;

wherein the front housing portion is disposed at the circuit board, and wherein, with the lens assembly optically aligned with the imager at the first side of the circuit board substrate, the circuit board is attached at the front housing portion;

wherein the rear housing portion is mated with the front housing portion to encase the circuit board within the housing;

a thermal interface material molded at an inner surface of the rear housing portion;

wherein the thermal interface material is formed to interface with the at least one electronic component at the second side of the circuit board substrate when the rear housing portion is mated with the front housing portion;

a connector element in electrical connection with the electronic circuitry of the circuit board, wherein, with the rear housing portion mated with the front housing portion, the connector element is at the rear housing portion;

wherein the connector element is configured to connect to a connector end of a wire harness of a vehicle to electrically connect the wire harness to the electronic circuitry of the circuit board when the vehicular camera module is mounted at the vehicle; and wherein the thermal interface material comprises a thermally conductive rubber over-mold that is molded over at least a portion of the inner surface of the rear housing portion.

12. A vehicular camera module for a vision system of a vehicle, the vehicular camera module comprising:

a housing comprising a front housing portion and a rear housing portion;

wherein the front housing portion includes a lens holder that accommodates a lens assembly therein, the lens assembly including at least one optical element;

a circuit board, the circuit board comprising a circuit board substrate having a first side and a second side opposite the first side, wherein the circuit board comprises electronic circuitry disposed at the circuit board substrate, and wherein an imager of the electronic circuitry is disposed at the first side of the circuit board substrate, and wherein at least one electronic component of the electronic circuitry is disposed at the second side of the circuit board substrate;

wherein the front housing portion is disposed at the circuit board, and wherein, with the lens assembly optically aligned with the imager at the first side of the circuit board substrate, the circuit board is attached at the front housing portion;

wherein the rear housing portion is mated with the front housing portion to encase the circuit board within the housing;

a thermal interface material molded at an inner surface of the rear housing portion;

wherein the thermal interface material is formed to interface with the at least one electronic component at the second side of the circuit board substrate when the rear housing portion is mated with the front housing portion;

a connector element in electrical connection with the electronic circuitry of the circuit board, wherein, with the rear housing portion mated with the front housing portion, the connector element is at the rear housing portion;

wherein the connector element is configured to connect to a connector end of a wire harness of a vehicle to electrically connect the wire harness to the electronic circuitry of the circuit board when the vehicular camera module is mounted at the vehicle; and wherein the thermal interface material is pressed against the circuit board and conforms with the at least one electronic component at the second side of the circuit board substrate when the rear housing portion is mated with the front housing portion.

13. A vehicular camera module for a vision system of a vehicle, the vehicular camera module comprising:

a housing comprising a front housing portion and a rear housing portion;

wherein the front housing portion includes a lens holder that accommodates a lens assembly therein, the lens assembly including at least one optical element;

a circuit board, the circuit board comprising a circuit board substrate having a first side and a second side opposite the first side, wherein the circuit board comprises electronic circuitry disposed at the circuit board substrate, and wherein an imager of the electronic circuitry is disposed at the first side of the circuit board substrate, and wherein at least one electronic component of the electronic circuitry is disposed at the second side of the circuit board substrate;

wherein the front housing portion is disposed at the circuit board, and wherein, with the lens assembly optically aligned with the imager at the first side of the circuit board substrate, the circuit board is attached at the front housing portion;

wherein the rear housing portion is mated with the front housing portion to encase the circuit board within the housing;

a thermal interface material molded at an inner surface of the rear housing portion;

wherein the thermal interface material is formed to interface with the at least one electronic component at the second side of the circuit board substrate when the rear housing portion is mated with the front housing portion;

a connector element in electrical connection with the electronic circuitry of the circuit board, wherein, with the rear housing portion mated with the front housing portion, the connector element is at the rear housing portion;

wherein the connector element is configured to connect to a connector end of a wire harness of a vehicle to electrically connect the wire harness to the electronic circuitry of the circuit board when the vehicular camera module is mounted at the vehicle; and wherein the thermal interface material is contoured so as to interface with electronic components of different heights at the second side of the circuit board substrate.

14. A vehicular camera module for a vision system of a vehicle, the vehicular camera module comprising:

a housing comprising a front housing portion and a rear housing portion;

wherein the front housing portion includes a lens holder that accommodates a lens assembly therein, the lens assembly including at least one optical element;

a circuit board, the circuit board comprising a circuit board substrate having a first side and a second side opposite the first side, wherein the circuit board comprises electronic circuitry disposed at the circuit board substrate, and wherein an imager of the electronic circuitry is disposed at the first side of the circuit board substrate, and wherein at least one electronic component of the electronic circuitry is disposed at the second side of the circuit board substrate;

wherein the front housing portion is disposed at the circuit board, and wherein, with the lens assembly optically aligned with the imager at the first side of the circuit board substrate, the circuit board is attached at the front housing portion;

wherein the rear housing portion is mated with the front housing portion to encase the circuit board within the housing;

a thermal interface material molded at an inner surface of the rear housing portion;

wherein the thermal interface material is formed to interface with the at least one electronic component at the second side of the circuit board substrate when the rear housing portion is mated with the front housing portion;

a connector element in electrical connection with the electronic circuitry of the circuit board, wherein, with the rear housing portion mated with the front housing portion, the connector element is at the rear housing portion;

wherein the connector element is configured to connect to a connector end of a wire harness of a vehicle to electrically connect the wire harness to the electronic circuitry of the circuit board when the vehicular camera module is mounted at the vehicle; and wherein the thermal interface material contacts the second side of the circuit board substrate.

15. A vehicular camera module for a vision system of a vehicle, the vehicular camera module comprising:

a housing comprising a front housing portion and a rear housing portion;

wherein the front housing portion includes a lens holder that accommodates a lens assembly therein, the lens assembly including at least one optical element;

a circuit board, the circuit board comprising a circuit board substrate having a first side and a second side opposite the first side, wherein the circuit board comprises electronic circuitry disposed at the circuit board substrate, and wherein an imager of the electronic circuitry is disposed at the first side of the circuit board substrate, and wherein at least one electronic component of the electronic circuitry is disposed at the second side of the circuit board substrate;

wherein the front housing portion is disposed at the circuit board, and wherein, with the lens assembly optically aligned with the imager at the first side of the circuit board substrate, the circuit board is attached at the front housing portion;

wherein the rear housing portion is mated with the front housing portion to encase the circuit board within the housing;

a thermal interface material molded at an inner surface of the rear housing portion;

wherein the thermal interface material is formed to interface with the at least one electronic component at the second side of the circuit board substrate when the rear housing portion is mated with the front housing portion;

a connector element in electrical connection with the electronic circuitry of the circuit board, wherein, with the rear housing portion mated with the front housing portion, the connector element is at the rear housing portion;

wherein the connector element is configured to connect to a connector end of a wire harness of a vehicle to electrically connect the wire harness to the electronic circuitry of the circuit board when the vehicular camera module is mounted at the vehicle; and wherein the thermal interface material has a custom geometric form that corresponds with the shape of the at least one electronic component at the second side of the circuit board substrate, and wherein the thermal interface material is pressed against the circuit board when the rear housing portion is mated with the front housing portion during assembly of the vehicular camera module.

16. A vehicular camera module for a vision system of a vehicle, the vehicular camera module comprising:
a housing comprising a front housing portion and a rear housing portion;
wherein the front housing portion includes a lens holder that accommodates a lens assembly therein, the lens assembly including at least one optical element;
a circuit board, the circuit board comprising a circuit board substrate having a first side and a second side opposite the first side, wherein the circuit board comprises electronic circuitry disposed at the circuit board substrate, and wherein an imager of the electronic circuitry is disposed at the first side of the circuit board substrate, and wherein at least one electronic component of the electronic circuitry is disposed at the second side of the circuit board substrate;
wherein the front housing portion is disposed at the circuit board, and wherein, with the lens assembly optically aligned with the imager at the first side of the circuit board substrate, the circuit board is attached at the front housing portion;
wherein the rear housing portion is mated with the front housing portion to encase the circuit board within the housing;
a thermal interface material molded at an inner surface of the rear housing portion;
wherein the thermal interface material is formed to interface with the at least one electronic component at the second side of the circuit board substrate when the rear housing portion is mated with the front housing portion;
a connector element in electrical connection with the electronic circuitry of the circuit board, wherein, with the rear housing portion mated with the front housing portion, the connector element is at the rear housing portion;
wherein the connector element is configured to connect to a connector end of a wire harness of a vehicle to electrically connect the wire harness to the electronic circuitry of the circuit board when the vehicular camera module is mounted at the vehicle; and
wherein the thermal interface material comprises a deformable material, and wherein the thermal interface material conforms to the at least one electronic component at the second side of the circuit board substrate when the rear housing portion is mated with the front housing portion.

17. A vehicular camera module for a vision system of a vehicle, the vehicular camera module comprising:
a housing comprising a front housing portion and a rear housing portion;
wherein the front housing portion includes a lens holder that accommodates a lens assembly therein, the lens assembly including at least one optical element;
a circuit board, the circuit board comprising a circuit board substrate having a first side and a second side opposite the first side, wherein the circuit board comprises electronic circuitry disposed at the circuit board substrate, and wherein an imager and electronic components of the electronic circuitry are disposed at the first side of the circuit board substrate, and wherein at least one electronic component of the electronic circuitry is disposed at the second side of the circuit board substrate;
a thermal interface material molded over at least a portion of an inner surface of said front housing portion;
wherein the front housing portion, with the thermal interface material molded thereat, is disposed at the circuit board, and wherein, with the lens assembly optically aligned with the imager at the first side of the circuit board substrate, the circuit board is attached at the front housing portion;
wherein the thermal interface material is formed to interface with the electronic components at the first side of the circuit board substrate when the front housing portion is attached at the circuit board;
wherein the thermal interface material comprises a deformable material, and wherein the thermal interface material conforms to the electronic components at the first side of the circuit board substrate when the front housing portion is attached at the circuit board;
wherein the rear housing portion is mated with the front housing portion to encase the circuit board within the housing;
another thermal interface material molded at an inner surface of the rear housing portion;
wherein the other thermal interface material is formed to interface with the at least one electronic component at the second side of the circuit board substrate when the rear housing portion is mated with the front housing portion;
wherein the other thermal interface material comprises a deformable material, and wherein the other thermal interface material conforms to the at least one electronic component at the second side of the circuit board substrate when the rear housing portion is mated with the front housing portion;
a connector element in electrical connection with the electronic circuitry of the circuit board, wherein, with the rear housing portion mated with the front housing portion, the connector element is at the rear housing portion;
wherein the connector element is configured to connect to a connector end of a wire harness of a vehicle to electrically connect the wire harness to the electronic circuitry of the circuit board when the vehicular camera module is mounted at the vehicle; and
wherein the thermal interface material and the other thermal interface material contact the circuit board substrate.

* * * * *